(12) United States Patent
Avritch et al.

(10) Patent No.: US 7,868,637 B2
(45) Date of Patent: Jan. 11, 2011

(54) SYSTEM AND METHOD FOR AUTOMATED DETECTION OF SINGULAR FAULTS IN DIODE OR'D POWER BUS CIRCUITS

(75) Inventors: Steven A. Avritch, Bristol, CT (US); Gary L. Hess, Enfield, CT (US)

(73) Assignee: Hamilton Sundstrand Corporation, Rockford, IL (US)

( * ) Notice: Subject to any disclaimer, the term of this patent is extended or adjusted under 35 U.S.C. 154(b) by 259 days.

(21) Appl. No.: 11/974,620

(22) Filed: Oct. 15, 2007

(65) Prior Publication Data
US 2009/0096479 A1 Apr. 16, 2009

(51) Int. Cl.
*G01R 31/02* (2006.01)
(52) U.S. Cl. .................................. 324/762.07
(58) Field of Classification Search .......... 324/765–772
See application file for complete search history.

(56) References Cited

U.S. PATENT DOCUMENTS

| | | | | | |
|---|---|---|---|---|---|
| 3,904,962 | A | * | 9/1975 | Olson, Jr. ..................... | 324/767 |
| 3,975,683 | A | * | 8/1976 | Behrens et al. ............. | 324/767 |
| 4,346,347 | A | * | 8/1982 | Kamata et al. .............. | 324/767 |
| 4,775,640 | A | * | 10/1988 | Chan ........................... | 438/16 |
| 5,399,956 | A | * | 3/1995 | DeLuca et al. .............. | 323/222 |
| 5,444,390 | A | * | 8/1995 | Bartlett et al. .............. | 324/770 |
| 6,342,791 | B1 | * | 1/2002 | Ichikawa et al. ............ | 324/767 |
| 2004/0196049 | A1 | * | 10/2004 | Yano et al. .................. | 324/523 |

* cited by examiner

*Primary Examiner*—Ha Tran T Nguyen
*Assistant Examiner*—Arleen M Vazquez
(74) *Attorney, Agent, or Firm*—Kinney & Lange, P.A.

(57) ABSTRACT

A system automatically detects singular faults in diode or'd power bus circuit comprised of a plurality of diodes. The system includes a diode test circuit that selectively applies a voltage pulse to one of the plurality of diodes and detects the presence of singular faults based on the monitored response to the voltage pulse.

14 Claims, 4 Drawing Sheets

SYSTEM AND METHOD FOR AUTOMATED DETECTION OF SINGULAR FAULTS IN DIODE OR'D POWER BUS CIRCUITS

BACKGROUND OF THE INVENTION

The present invention is related to input power management, and more specifically to test circuitry for automatically detecting singular faults in diode or'd power bus circuits.

A number of applications, such as safety critical avionics, make use of independent, redundant power input sources. In the event that one or more of the input sources fails, another of the available redundant power input sources is employed to ensure an uninterrupted supply of power.

FIG. 1 is a circuit diagram illustrating a common diode or'd power bus circuit configuration used to combine independent, redundant power input sources into a common internal source. The diode or'd power bus circuit consists of a number of power diodes (labeled PD1-PDN), each connected to one of the redundant power input sources. The redundant power source providing the highest quality power causes the associated diode to conduct, resulting in the highest level of quality power being propagated through the diode or'd power bus circuit and provided as the internal power source. The remainder of the power diodes within the diode power input circuit provide isolation to prevent the remaining input sources from sourcing power to the internal power source (i.e., the other diodes would be in a non-conducting state).

In the event that the redundant power supply being used to generate the internal power source failed, one of the other redundant power sources would cause an associated diode to conduct, and the power input source connected to the conducting diode would be propagated through the diode or'd power bus circuit and provided as the internal power source. However, a faulty diode (i.e., a diode that fails to conduct) will result in the interruption of the internal power source.

Therefore, it would be desirable to provide a system/method of detecting singular faults within a diode or'd power bus circuit.

BRIEF SUMMARY OF THE INVENTION

Described herein is a system for automatically detecting singular faults in diode or'd power bus circuits. The system includes a diode test circuit that selectively applies a voltage pulse to one of the plurality of diodes within the diode or'd power bus circuit and detects singular faults based on the monitored response of the diode or'd power bus circuit to the voltage pulse.

DETAILED DESCRIPTION

The present invention describes a test circuit for automatically detecting singular faults in a diode or'd power bus circuit (i.e., failed power diodes). In particular, the test circuit includes a charge-up circuit for developing a voltage pulse and a diode test circuit for selectively applying the voltage pulse to a power diode within the diode or'd power bus circuit. After delivering the voltage pulse to one of the power diodes, the test circuit monitors the output of the diode or'd power bus circuit to determine whether the voltage pulse was propagated through the power diode to which the voltage pulse was applied. A voltage pulse that propagates through the diode or'd power bus circuit indicates that the power diode to which the pulse was applied is working properly. In this way, the test circuit is able to detect singular faults within the diode or'd power bus circuit.

Figure 1:
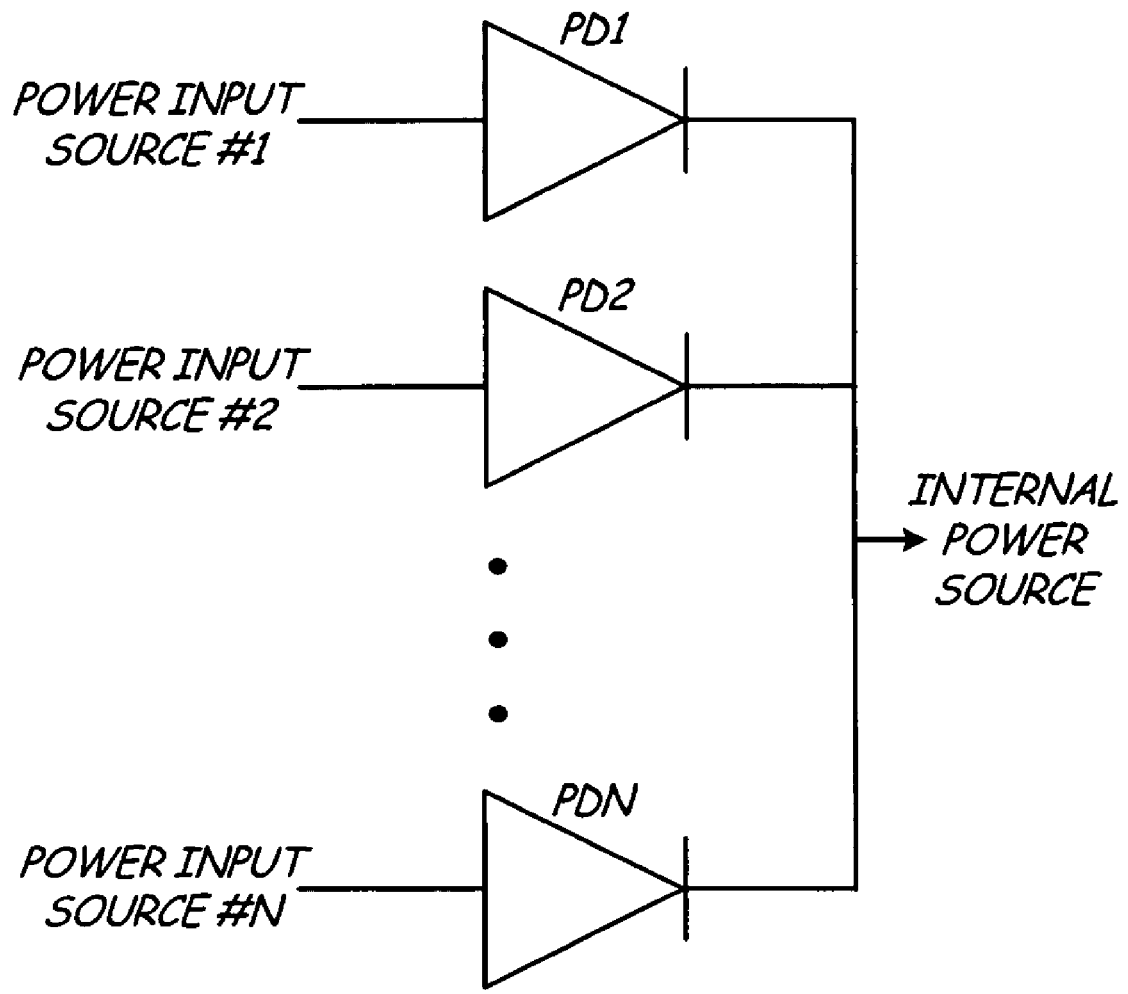
FIG. 1 is a circuit diagram of a diode power input circuit.
Figure 2:
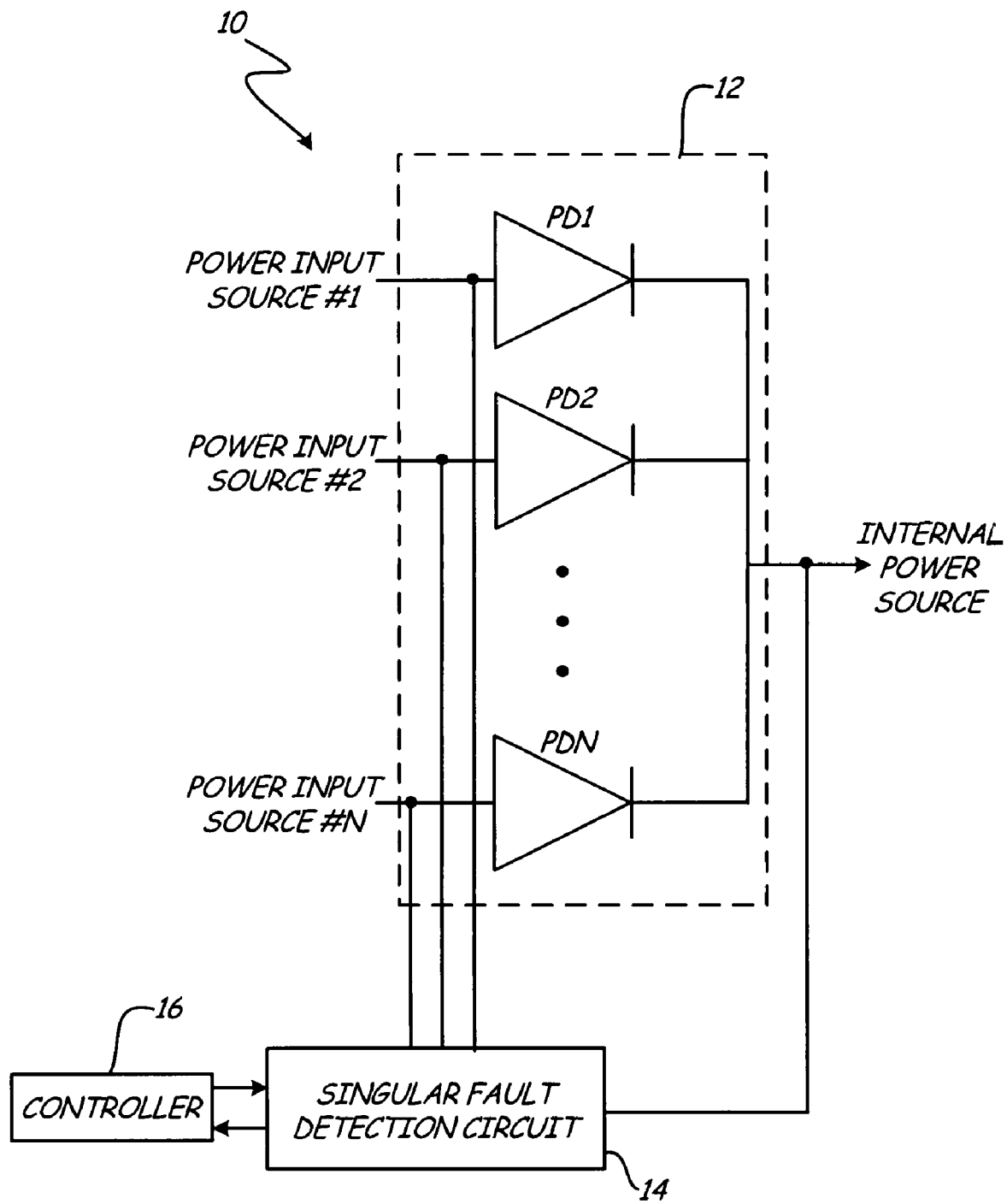
FIG. 2 is a circuit diagram of a diode or'd power bus circuit and a test circuit for detecting singular faults in the diode or'd power bus circuit.

FIG. 2 is a circuit diagram illustrating an exemplary embodiment of power bus system 10, which includes diode or'd power bus circuit 12, singular fault detection circuit 14 and controller 16. As shown in FIG. 2, singular fault detection circuit 14 is connected on an input side of diode or'd power bus circuit 12 between each power source and an associated power diode PD1-PDN. Singular fault detection circuit 14 is also connected on an output side of diode or'd power bus circuit 12 to monitor the voltage provided by diode or'd power bus circuit 12. In addition, controller 16 is connected to communicate with singular fault detection circuit 14.

In an exemplary embodiment, controller 16 provides control instructions to singular fault detection circuit 14. In response to the control instructions, singular fault detection circuit 14 develops a voltage pulse and selectively delivers the voltage pulse to one of the plurality of power diodes PD1-PDN. The magnitude of the voltage pulse provided by singular fault detection circuit 14 is greater in magnitude than the power provided by any one of the power bus sources. In this way, the voltage pulse causes the power diode to which it is applied to momentarily conduct (if it is working properly), resulting in the voltage pulse being propagated through diode or'd power bus circuit 12. Singular fault detection circuit 14 monitors the output voltage provided by diode or'd power bus circuit 12 to detect whether the voltage pulse has been propagated through the selected power diode to which it was applied. Detection of the pulse on the output side of diode or'd power bus circuit 12 indicates that the power diode tested is operational and functioning properly. The result of the test (i.e., whether the voltage pulse was detected on the output of diode or'd power bus circuit 12) is communicated to controller 16.

A complete test of diode or'd power bus circuit 12 includes applying a test pulse to each power diode PD1-PDN individually. This may be done sequentially by applying a voltage test pulse to first power diode PD1, monitoring the resulting output voltage to determine if power diode PD1 was able to conduct, and repeating the test for each power diode included within diode or'd power bus circuit 12. In an exemplary embodiment, the order in which power diodes PD1-PDN are tested is determined by controller 16, which communicates control instructions to singular fault detection circuit 14 to selectively apply voltage pulses in a deterministic manner to each power diode within diode or'd power bus circuit 12. In addition, the results of all tests (i.e., whether the voltage pulse was detected on the output of diode or'd power bus circuit 12) are communicated to controller 16. Based on these results, controller 16 determines whether any singular faults exist within power bus diode circuit 12.

Testing of diode or'd power bus circuit 12 may be initiated manually or automatically. For example, in an aerospace application, a maintenance worker or pilot may provide a signal to controller 16 to initialize a test of diode or'd power bus circuit 12. Controller 16 implements the test and provides the results of the test (i.e., whether any singular faults were detected) back to the pilot or maintenance worker. In another embodiment, controller 16 is configured to automatically initialize a test upon start-up of the system or at some other predetermined schedule. A benefit of the automatic initialization of a test, particularly in aerospace applications, is that integrity of the diode power bus input is validated (or faults detected) prior to each take-off. Another benefit of singular fault detection circuit 14, is the voltage pulse used to test the power diodes will not adversely affect the operation of any devices connected to receive power from diode or'd power bus circuit 12. Thus, a test may be initialized and carried out during operation of diode or'd power bus circuit 12.

In an exemplary embodiment, controller 16 may be implemented with a Field Programmable Gate Array (FPGA) that is programmed to provide the desired control instructions and to respond to the outputs provided by singular fault detection circuit 14. In other embodiments, controller 16 may be implemented with a combination of hardware and/or software components capable of controlling the selective application of voltage pulses to diode power bus input 12, and detecting singular faults within diode power bus input 12 based on the response to the selective application of voltage pulses.

Figure 3A:
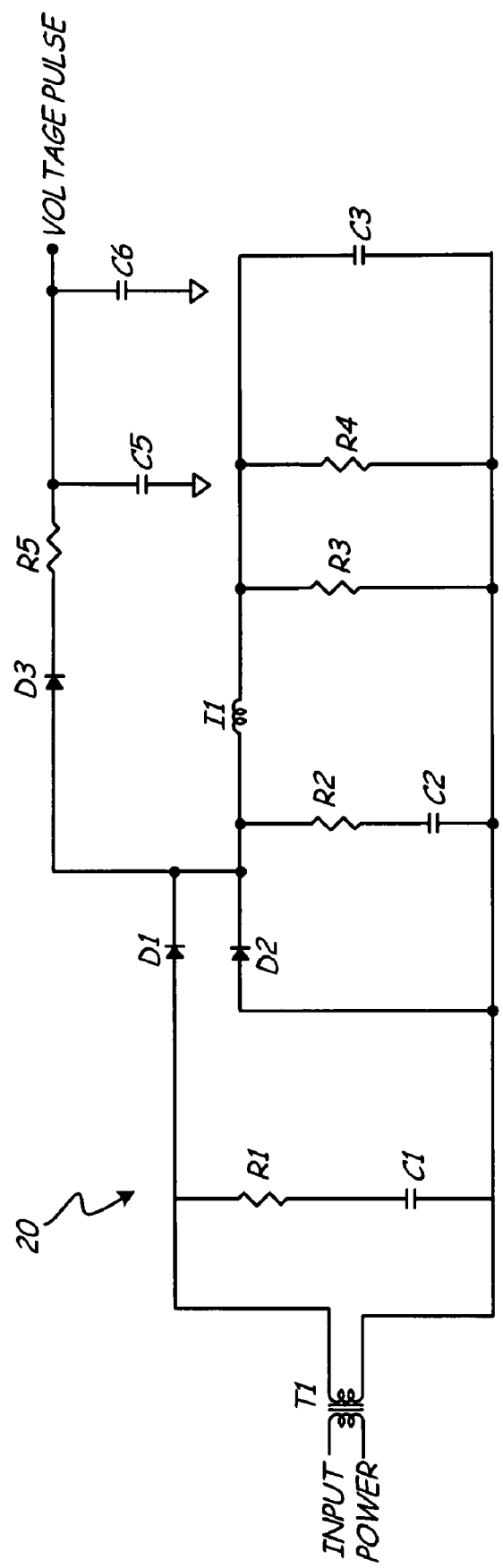
FIGS. 3A and 3B are circuit diagrams of an exemplary embodiment of the test circuit shown in FIG. 2.
Figure 3B:
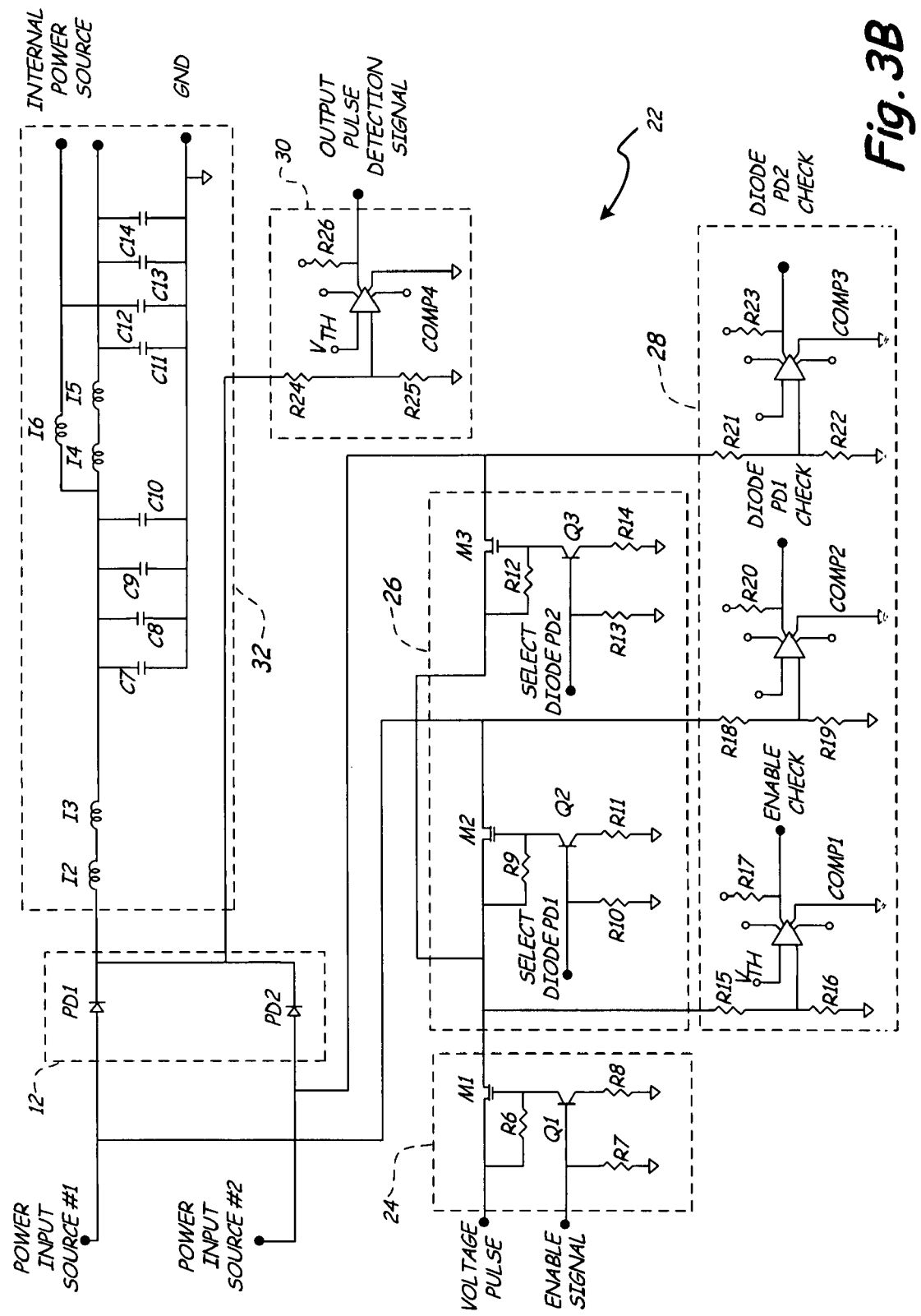

FIGS. 3A and 3B are circuit diagrams that illustrate an exemplary embodiment of singular fault detection circuit 14, which includes charge-up circuit 20 (shown in FIG. 3A) and diode test circuit 22 (shown in FIG. 3B).

FIG. 3A is a circuit diagram of an exemplary embodiment of charge-up circuit 20, which generates the voltage pulse that is applied to the input side of diode or'd power bus circuit 12 (as shown in FIG. 2). In an exemplary embodiment, charge-up circuit 20 includes resistors R1, R2, R3, R4 and R5, capacitors C1, C2, C3, C4, and C5, diodes D1, D2 and D3 (different than the power diodes shown in FIG. 2), inductor I1, and transformer secondary T1. Alternating current (AC) power is connected to provide energy to transformer secondary T1. The alternating current power provided to transformer secondary T1 conducts through diodes D1 and D3, causing voltage to buildup in capacitors C5 and C6. In this way, a large voltage potential can be generated in capacitors C5 and C6 and made available as an output (labeled here as 'Voltage Pulse'). In other embodiments any number of well-known circuit configurations, such as switch-mode power supplies (SMPSs), may be used to generate a desired voltage pulse.

The magnitude of the voltage pulse developed by charge-up circuit 20 is dependent on the application, and in particular on the magnitude of voltages supplied by the input power buses. The magnitude of the voltage pulse should be greater than the magnitude of the power bus sources such that application of the voltage pulse to diode or'd power bus circuit 12 will cause the power diode to which it is applied to momentarily conduct the voltage pulse.

FIG. 3B is a circuit diagram of an exemplary embodiment of diode test circuit 22, which selectively applies the voltage pulse generated by charge-up circuit 20 to one of the plurality of power diodes. In addition, diode test circuit 22 monitors the output voltage provided by the power diodes to detect whether the voltage pulse applied to the input side of diode or'd power bus circuit 12 was propagated to the output side of diode or'd power bus circuit 12.

In the example shown in FIG. 3B, diode test circuit 22 is connected to deliver voltage pulses (labeled 'Voltage Pulse') to power diodes PD1 and PD2 included within diode or'd power bus circuit 12 and to monitor the resulting voltage generated as an output of diode or'd power bus circuit 12. For the sake of simplicity, in the embodiment shown in FIG. 3B only two power diodes PD1 and PD2 are shown, although the concepts described could be extended to embodiments having more power diodes included within diode or'd power bus circuit 12.

In particular, the embodiment of diode test circuit 22 shown in FIG. 3B includes test enabler circuit 24, diode selection circuit 26, voltage pulse validation circuit 28, voltage pulse detection circuit 30, and power supply bus circuit 32. In addition diode test circuit 22 is connected to receive control signals (i.e., instructions) from controller 16 and to provide outputs signals to controller 16 (shown in FIG. 2).

In an exemplary embodiment, test enable circuit 24 is connected to receive as input the voltage pulse (labeled 'Voltage Pulse') developed by charge-up circuit 20 and a control signal provided by controller 16 (labeled 'Enable Signal'). The voltage pulse is provided across field effect transistor (FET) M1, which acts as a switching device that selectively provides the voltage pulse to diode selection circuit 26. The enable signal is connected to the base of bipolar junction transistor (BJT) Q1, which in turn is connected to the gate of FET M1. Thus, the enable signal supplied by controller 16 determines whether the voltage pulse is applied to diode selection circuit 26. For instance, to initialize a test, controller 16 would generate an enable signal such that the voltage pulse provided by charge-up circuit 20 is applied to diode selection circuit 26.

Diode selection circuit 26 determines to which power diode (in this case power diode D1 or power diode D2) the voltage pulse should be applied. Control signals (labeled 'Select Diode PD1' and 'Select Diode PD2') provided by controller 16 to BJT Q2 and BJT Q3, respectively, control the operation of transistors M2 and M3. For example, to apply a voltage pulse to power diode PD1, controller 16 applies control signal 'Select Diode PD1' to the base of BJT Q2, which in turn causes transistor M3 to conduct and the voltage pulse to be selectively applied to power diode PD1. In this way, the voltage pulse can be selectively applied to a power diode within diode or'd power bus circuit 12.

Voltage pulse validation circuit 28 is connected to monitor the voltage provided by test enable circuit 24 and diode selection circuit 26. In particular, voltage pulse validation circuit 28 monitors whether a voltage pulse is delivered to diode or'd power bus circuit 12 and generates in response output signals that are provided to controller 16. In this way, voltage pulse validation circuit 28 provides a means of validating the test of a particular power diode by ensuring that a voltage pulse was in fact delivered to a selected power diode as desired.

In particular, in the embodiment shown in FIG. 3B, voltage pulse testing circuit 28 includes three comparators Comp1, Comp2, and Comp3 connected to monitor the output of test enable circuit 24 and the output from each transistor M2 and M3 of diode selection circuit 26, respectively. Each comparator circuit compares the monitored voltage to a threshold value to determine if the voltage pulse was propagated. A divider network consisting of two or more resistors (e.g., resistors R15 and R16 connected between the monitored voltage and comparator Comp1) are used to reduce the magnitude of the voltage pulse to a lower voltage before being applied to one of the comparator circuits.

For example, a properly delivered voltage pulse provided by test enable circuit 24 will result in the voltage monitored by comparator Comp1 exceeding the threshold voltage $V_{th}$. In response, comparator Comp1 will generate an output signal (labeled 'Enable Check') that indicates that the voltage pulse was properly delivered to diode selection circuit 26. Likewise, comparators Comp2 and Comp3 monitor the voltage provided by transistors M2 and M3 to detect whether the voltage pulse is propagated through diode selection circuit 26 as desired to diode or'd power bus circuit 12. Comparators Comp2 and Comp3 generate check signals (labeled "Diode PD1 Check" and "Diode PD2 Check", respectively) indicating whether the voltage pulse was properly applied to the selected diode. The output of each comparator, indicating whether the voltage pulse was detected, is provided to controller 16, which uses the outputs provided by comparators Comp1, Comp2 and Comp3 to validate the results of a test. For instance, if power diode PD1 is being tested, and the output of Comp2 (labeled "Diode PD1 Check") indicates that no voltage pulse was delivered to power diode PD1, then controller 16 will not treat the inability to detect a voltage pulse on the output of diode or'd power bus circuit 12 as necessarily indicative of a failure of the power diode being tested.

Voltage pulse detection circuit 30 monitors the voltage of diode or'd power bus circuit 12 to determine if a voltage pulse applied to either power diode PD1 or power diode PD2 was propagated through as desired. Comparator circuit C4 compares the monitored voltage to a threshold voltage $V_{th}$. Once again, a voltage divider network including resistors R24 and R25 is used to reduce the magnitude of the monitored voltage to a level that can be applied to comparator Comp4. If the voltage pulse is properly propagated by the power diode being tested, the magnitude of the monitored voltage will exceed the threshold voltage Vth and comparator Comp4 will generate an output signal (labeled 'Output Pulse Detection Signal') indicating that the voltage pulse was detected and that the power diode circuit being tested is working properly. The detection (or failure to detect) the voltage pulse is communicated to controller 16. Based on the outputs generated by diode test circuit 22, controller 16 is able to detect singular faults within diode or'd power bus circuit 12. The threshold voltage Vth used by comparator Comp4 may be the same threshold used bay comparator Comp1-Comp3 as described with respect to voltage pulse testing circuit 28.

As discussed above, power supply circuit 32 generates an internal power source based on the power input source (either power input source #1 or power input source #2) selected by power selection circuit 12. Power supply circuit 32 includes a number of inductors 12, 13, 14, 15 and 16, and a number of capacitors C7, C8, C9, C10, C11, C12, C13 and C14 that operate to regulate the power bus output to a desirable magnitude and quality. In addition, in an exemplary embodiment power supply circuit 32 removes ripples and variations in the output power caused by the application of voltage pulses to the input of diode or'd power bus circuit 12. The internal power source is provided as an input to any number of systems or sub-systems, depending on the application.

Although the present invention has been described with reference to preferred embodiments, workers skilled in the art will recognize that changes may be made in form and detail without departing from the spirit and scope of the invention. For instance, the exemplary embodiments described with respect to FIGS. 3A and 3B may be implemented with other configurations of components to provide the same functionality as that provided by the exemplary embodiment.

The invention claimed is:

1. A system for automatically detecting singular faults in diode or'd power bus circuits, the system comprising:
   a diode or'd power bus circuit that includes a plurality of diodes connectable to distribute power from one of a plurality of power sources to a load; and
   a singular fault detection circuit that applies a voltage pulse having a voltage magnitude greater than a voltage magnitude of the plurality of power sources to each of the plurality of diodes, one at a time, and detects singular faults in the diode or'd power bus circuit based on monitored responses to the voltage pulse.

2. The system of claim 1, wherein the singular fault detection circuit includes:
   a charge-up circuit for generating the voltage pulses applied to each of the plurality of diodes.

3. The system of claim 2, wherein the singular fault detection circuit includes:
   a selection circuit connected to selectively distribute each voltage pulse to one of the plurality of diodes in the diode or'd power bus circuit.

4. The system of claim 3, wherein the singular fault detection circuit includes:
   a validation circuit connected to monitor the propagation of each voltage pulse through the selection circuit to validate whether the voltage pulse is properly applied to the selected diode within the diode or'd power bus circuit.

5. The system of claim 1, wherein the singular fault detection circuit includes:
   a voltage pulse detection circuit connected to monitor an output voltage of the diode or'd power bus circuit to determine whether each voltage pulse applied to the diode or'd power bus circuit was propagated through the diode to which it was applied.

6. The system of claim 1, further including:
   a controller connected to provide control instructions to the singular fault detection circuit to cause the voltage pulse to be applied to one of the plurality of diodes selected by the controller.

7. The system of claim 6, wherein the controller validates the result of a diode test based on validation data and voltage pulse detection data received from the singular fault detection circuit.

8. A method for detecting singular faults in a diode or'd power bus circuit, the method comprising:
   generating voltage pulses having a magnitude greater than a voltage magnitude of input power provided to each of a plurality of diodes within the diode or'd power bus circuit;
   applying the generated voltage pulses, one at a time, to each of the plurality of diodes within the diode or'd power bus circuit;
   monitoring a voltage generated by the diode or'd power bus circuit in response to the voltage pulses applied to each of the plurality of diodes within the diode or'd power bus circuit; and
   detecting singular faults in the diode or'd power bus circuit based on the monitored voltage response.

9. The method of claim 8, wherein detecting singular faults in the diode or'd power bus circuit includes:
   detecting whether a voltage pulse was propagated through the diode to which it was applied, wherein failure to propagate the voltage pulse indicates a singular fault in the diode to which the voltage pulse was applied.

10. The method of claim 9, further including:

monitoring the voltage pulse being applied to one of the plurality of diodes to validate; and validating the detection of a singular fault based on the monitored voltage response and the monitored voltage pulse applied to the power bus circuit.

11. A singular fault detection circuit for detecting singular faults in a diode or'd power bus circuit for distributing power from one of a plurality of input sources to a load, the singular fault detection circuit comprising:

a charge-up circuit for developing voltage pulses greater than voltages associated with the input sources;

a diode test circuit connected to selectively distribute voltage pulses developed by the charge-up circuit, one at a time, to each of a plurality of diodes in the diode or'd power bus circuit and to monitor the propagation of each voltage pulse through the diode test circuit and through the diode to which the voltage pulse is applied; and a controller connected to provide control instructions to the diode test circuit to cause the selective application of each voltage pulse to one of the plurality of diodes and to receive data from the diode test circuit regarding the propagation of the voltage pulse.

12. The singular fault detection circuit of claim 11, wherein the data provided by the diode test circuit to the controller includes validation data indicating whether the voltage pulse was delivered to one of the plurality of diodes within the diode or'd power bus circuit.

13. The singular fault detection circuit of claim 12, wherein the data provided by the diode test circuit to the controller includes detection data indicating whether the voltage pulse was propagated through the diode to which it was applied.

14. The singular fault detection circuit of claim 13, wherein the controller detects singular faults based on the detection data and the validation data.

* * * * *